US007403870B2

(12) United States Patent
Yasukawa et al.

(10) Patent No.: US 7,403,870 B2
(45) Date of Patent: Jul. 22, 2008

(54) TROUBLE SENSING DEVICE

(75) Inventors: Kaoru Yasukawa, Ashigarakami-gun (JP); Koji Adachi, Ashigarakami-gun (JP); Norikazu Yamada, Ashigarakami-gun (JP); Koki Uwatoko, Ashigarakami-gun (JP); Eigo Nakagawa, Ashigarakami-gun (JP); Tetsuichi Satonaga, Ashigarakami-gun (JP)

(73) Assignee: Fuji Xerox Co., Ltd., Tokyo (JP)

( * ) Notice: Subject to any disclaimer, the term of this patent is extended or adjusted under 35 U.S.C. 154(b) by 100 days.

(21) Appl. No.: 11/242,014

(22) Filed: Oct. 4, 2005

(65) Prior Publication Data

US 2006/0226846 A1 Oct. 12, 2006

(30) Foreign Application Priority Data

Mar. 23, 2005 (JP) ............................ 2005-084816

(51) Int. Cl.
*G01R 31/00* (2006.01)

(52) U.S. Cl. ...................................................... 702/183

(58) Field of Classification Search ................. 702/183
See application file for complete search history.

(56) References Cited

U.S. PATENT DOCUMENTS 4,994,986 A * 2/1991 Cihiwsky et al. ........... 358/1.14

FOREIGN PATENT DOCUMENTS

| | | | |
|---|---|---|---|
| JP | 11-101546 | * | 4/1999 |
| JP | 2001-228056 | * | 8/2001 |
| JP | A 2001-228056 | | 8/2001 |
| JP | A 2003-228419 | | 8/2003 |

* cited by examiner

*Primary Examiner*—Tung S Lau
(74) *Attorney, Agent, or Firm*—Oliff & Berridge, PLC

(57) ABSTRACT

A trouble sensing device has a first unit and a second unit. The first unit determines a total sum of driving current of two or more of a plurality of driving mechanisms that are turned on. The second unit judges whether trouble has arisen based on the total sum of the driving current.

14 Claims, 6 Drawing Sheets

FIG.3

162

NORMAL CURRENT WAVEFORMS CORRESPONDING TO OPERATIONAL STATES

| NORMAL CURRENT WAVEFORMS OF PATTERN 1 (A4, SHEET FEED TRAY, SINGLE SIDED PRINTING) | | . . . | NORMAL CURRENT WAVEFORMS OF PATTERN n | |
|---|---|---|---|---|
| TIME PERIOD A-B | NUDGER SOLENOID | | TIME PERIOD A-B | NUDGER SOLENOID |
| | FEED MOTOR | | | FEED MOTOR |
| | ⋮ | | | ⋮ |
| | MAIN MOTOR | | | MAIN MOTOR |
| ⋮ | ⋮ | . . . | ⋮ | ⋮ |
| TIME PERIOD I-J | NUDGER SOLENOID | | TIME PERIOD I-J | NUDGER SOLENOID |
| | FEED MOTOR | | | FEED MOTOR |
| | ⋮ | | | ⋮ |
| | MAIN MOTOR | | | MAIN MOTOR |

TROUBLE SENSING DEVICE

CROSS-REFERENCE TO RELATED APPLICATION

This application claims priority under 35 USC 119 from Japanese Patent Application No. 2005-84816, the disclosure of which is incorporated by reference herein.

BACKGROUND OF THE INVENTION

1. Field of the Invention

The present invention relates to a trouble sensing device of mechanical driving mechanisms driven by supplying driving current.

2. Description of the Related Art

Motors, solenoids, clutches, fans for cooling, and the like are mechanical driving mechanisms driven by supplying driving current and these are provided at an image forming device, a copier, or the like.

When there is trouble with these driving mechanisms, it is necessary to detect the trouble of each part of the mechanisms.

Conventionally, the following was proposed as a method for diagnosing trouble: a polygon motor, a solenoid, and a clutch are each driven independently under instructions from a CPU. The currents supplied to the respective drivers and motors and the like are sensed by the potential differences at the both ends of the resistors, and the current values which are sensed are monitored at the CPU. On the basis of inputted voltage values, the CPU carries out trouble diagnosis of the polygon motor, the solenoid, and the clutch (see, for example, Japanese Patent Application Laid-Open (JP-A) No. 2001-228056).

Carrying out trouble sensing of a part as follows has also been proposed: a reference current, which shows that a given, specific part is functioning correctly, is stored in a computer memory. While only that specific part is consuming current, the current which is supplied to an image forming device which includes that specific part is read. The read current value and the reference current stored in the memory are compared, and trouble sensing of the part is carried out in accordance with whether the read current value matches the reference current (see, for example, JP-A No. 2003-228419).

However, in accordance with the aforementioned technique disclosed in JP-A No. 2001-228056, each part must be operated one-by-one in order to measure the currents of the respective parts. There is therefore the problem that a specific inspection mode or trouble diagnosing mode must be implemented.

There is also the problem that a very long time is needed in order to operate each part one-by-one, and the period of time over which the user cannot utilize the image forming device (the down time) is long.

Further, in the technique disclosed in JP-A No. 2003-228419, the trouble sensing can be carried out while the user is using the device. Therefore, although the problem of down time for trouble sensing arising does not occur, the trouble sensing cannot be carried out unless there is a state in which only the specific (one) part is being operated. Therefore, there is the problem that trouble sensing is hardly carried out at all in devices, such as image forming devices, in which, when the start button is pressed, plural parts immediately carry out operation almost simultaneously.

SUMMARY OF THE INVENTION

A trouble sensing device has a first unit and a second unit. The first unit determines total sum of driving current of a plurality of driving mechanisms. The second unit judges whether trouble has arisen based on the total sum of the driving current. A trouble sensing method has storing a plurality of normal driving current values expressing driving current at a time when a plurality of driving mechanisms are respectively driving normally, detecting a value of driving current of the plurality of driving mechanisms, comparing a total sum of the normal driving current values with the detected value of driving current and judging whether trouble has arisen based on a result of the comparing. A storage medium readable by a computer, the storage medium storing a program of instructions executable by the computer to perform a function for sensing trouble, the function has storing a plurality of normal driving current values expressing driving current at a time when a plurality of driving mechanisms are respectively driving normally, detecting a value of driving current of the plurality of driving mechanisms, comparing a total sum of the normal driving current values with the detected value of driving current and judging whether trouble has arisen based on a result of the comparing.

BRIEF DESCRIPTION OF THE DRAWINGS

Embodiments of the present invention will be described in detail based on the following figures, wherein:

FIG. 3 is a schematic diagram showing a state in which normal current waveforms relating to the present embodiment are stored in a current value storing section;

DETAILED DESCRIPTION OF THE INVENTION

Figure 1:
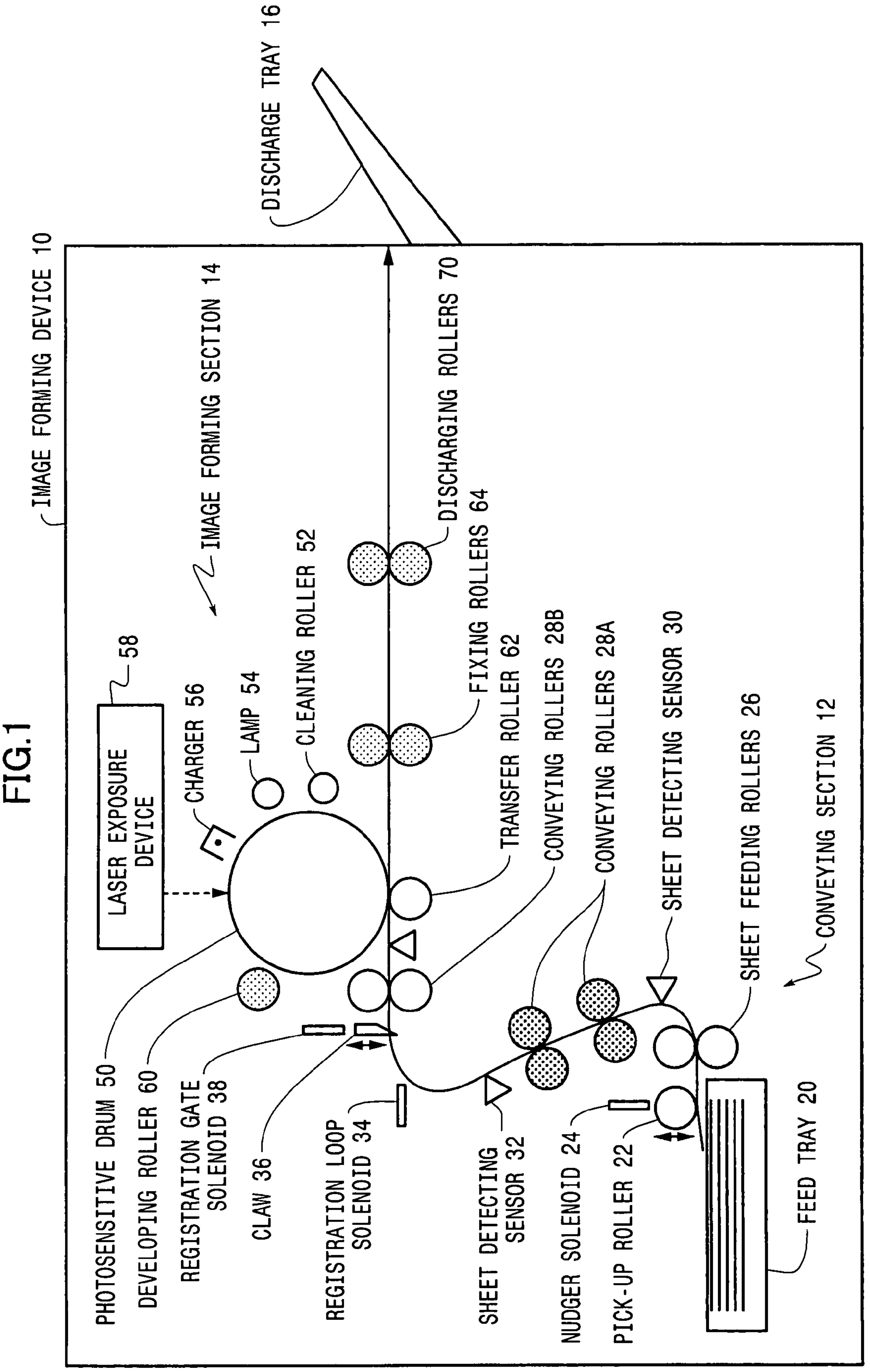
FIG. 1 is a schematic diagram showing the structure of an image forming device relating to an embodiment.

The structure of an image forming device 10 relating to an embodiment is shown schematically in FIG. 1. According to an embodiment the present invention is applied to an image forming device.

As shown in FIG. 1, the image forming device 10 is structured by a conveying section 12 which conveys sheets, and an image forming section 14 which forms images. A sheet feed tray 20 is provided at the conveying section 12, and sheets, which serve as recording media on which images are formed, are accommodated in the sheet feed tray 20 in a stacked manner. A pick-up roller 22 and sheet feeding rollers 26 are provided at the top surface side of the sheets stacked in the sheet feed tray 20. The pick-up roller 22 is structured so as to be rotatable and so as to be able to abut or move away from the sheet by the operation of a nudger solenoid 24. The sheet feeding rollers 26 also are rotatable. When the pick-up roller 22 is rotated in a state of abutting the sheet, one sheet is taken-out from the sheet feed tray 20. When the leading end of the sheet which is taken-out reaches the sheet feeding rollers 26, due to the rotation of the sheet feeding rollers 26, the sheet is fed onto the conveying path toward the image forming section 14.

A sheet detecting sensor 30 is provided at the downstream side, in the direction of feeding the sheet, of the sheet feeding rollers 26. The absence/presence of a sheet at the downstream side of the sheet feeding rollers 26 is thereby detected. Further, plural conveying rollers 28 are disposed, along the conveying path of the sheet, at the downstream side of the sheet detecting sensor 30. The sheet detection signal of the sheet detecting sensor 30 is used as a trigger for controlling the rotation of the conveying rollers 28.

At a predetermined position on the conveying path of the sheet and in a vicinity of the image forming section 14, there is disposed a sheet detecting sensor 32, which detects the absence/presence of the sheet at that position. A registration-loop solenoid 34 and a claw 36 are disposed at the downstream side thereof. Due to operation of a registration-gate solenoid 38, the claw 36 is pushed-out onto the conveying path of the sheet or retracted from the conveying path. Due to the claw 36 being pushed-out onto the conveying path, the leading end of the sheet, which is conveyed-in onto the conveying path, is stopped once, and the conveying timing thereof is adjusted. The registration-loop solenoid 34 forms a loop such that the sheet, whose conveying is stopped by the claw 36, does not separate from the conveying path.

The sheet detection signal of the sheet detecting sensor 32 is used as a trigger for the control of the registration-loop solenoid 34 and the registration-gate solenoid 38.

On the other hand, a cylindrical photosensitive drum 50 is provided in the image forming section 14. A cleaning roller 52, a lamp 54, a charger 56, a laser exposing device 58, a developing roller 60, and a transfer roller 62 are disposed in that order at the peripheral surface of the photosensitive drum 50. The photosensitive drum 50 is rotated, with the axial center thereof fixed, such that the surface thereof successively faces the respective regions.

The cleaning roller 52 adsorbs and removes toner and the like which adhere to the surface of the photosensitive drum 50. The lamp 54 removes charges at the surface of the photosensitive drum 50. The charger 56 charges the surface of the photosensitive drum 50 to a uniform potential.

The laser exposure device 58 irradiates laser light, on the basis of image data which is the subject of image formation, onto the surface of the photosensitive drum 50 which is charged uniformly. An electrostatic latent image is thereby formed on the surface of the photosensitive drum 50. Further, toner adheres uniformly to the peripheral surface of the developing roller 60, and the developing roller 60 is rotated so as to apply the toner to and develop the electrostatic latent image formed on the surface of the photosensitive drum 50, and form a toner image. The transfer roller 62 makes the sheet, which is conveyed-in, tightly contact the photosensitive drum 50 so as to transfer the toner image on the surface of the photosensitive drum 50 onto the sheet.

Fixing rollers 64 are provided on the conveying path of the sheet, at the downstream side of the photosensitive drum 50 and the transfer roller 62. The fixing rollers 64 are structured by a heating roller and a pressing roller. While nipping and conveying the sheet, to which the toner is transferred, between these two rollers, the fixing rollers 64 fuse and clamp the toner on the surface of the sheet so as to fix the toner to the sheet.

Discharging rollers 70 are provided at the conveying direction downstream side of the fixing rollers 64. The sheet, on which the image is formed, is conveyed by the discharging rollers 70 and discharged out onto a discharge tray 16.

Figure 2:
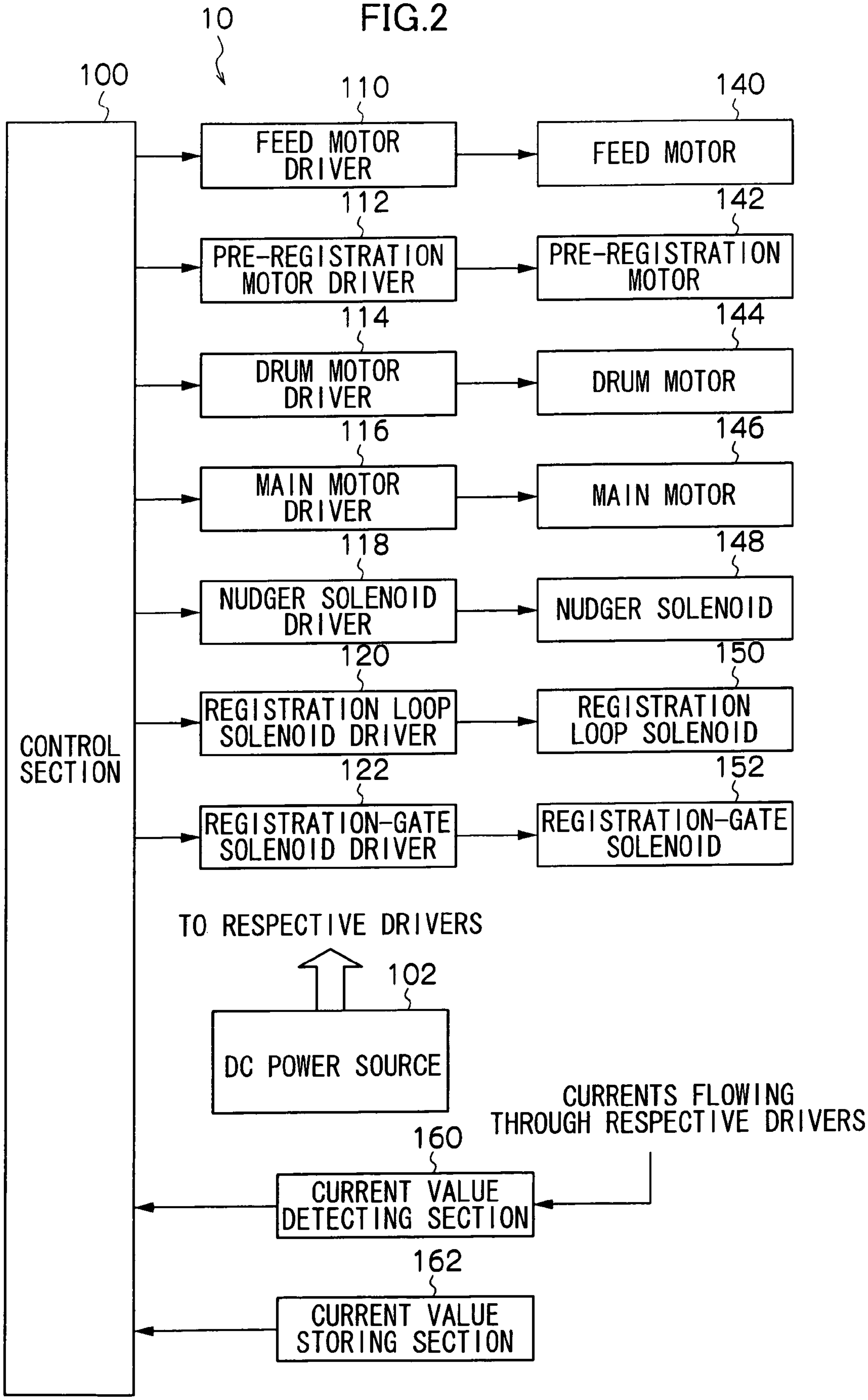
FIG. 2 is a block diagram centering around a driving system for driving respective regions of the image forming device relating to the embodiment.

A block diagram centering on the driving system for driving the respective regions of the image forming device relating to the present embodiment, is shown in FIG. 2.

As shown in FIG. 2, the image forming device 10 is structured so as to include a control section 100 which controls the overall operation; a feed motor 140, a pre-registration motor 142, a drum motor 144, a main motor 146 serving as a driving sources for rotating and driving the above-described various rollers and drum and the like; and a feed motor driver 110, a pre-registration motor driver 112, a drum motor driver 114, and a main motor driver 116 which are for driving the respective motors. The motors are connected to the control section 100 via the corresponding motor drivers. The motor drivers drive the respective motors to set them in driven states corresponding to instructions of the control section 100.

The driving force of the feed motor 140 is transferred to the pick-up roller 22 and the sheet feeding rollers 26 and rotates them. The driving force of the pre-registration motor 142 is transferred to conveying rollers 28A and rotates them. The driving force of the drum motor 144 is transferred to the photosensitive drum 50, the cleaner roller 52, a conveying roller 28B and the transfer roller 62, and rotates them. The driving force of the main motor 146 is transferred to the developing roller 60, the fixing rollers 64, and the discharging rollers 70, and rotates them.

Further, as shown in FIG. 2, the image forming device 10 is structured to include a nudger solenoid driver 118, a registration-loop solenoid driver 120, and a registration-gate solenoid driver 122 for operating the aforementioned nudger solenoid 24, registration-loop solenoid 34 and registration-gate solenoid 38, respectively. The respective solenoid drivers are connected to the control section 100, and operate the respective solenoids in accordance with instructions from the control section 100.

The image forming device 10 is structured to include a DC power source 102. DC electric power is supplied to the respective motor drivers and solenoid drivers which require DC electric power.

In the present embodiment, there are provided a current value detecting section 160 for detecting the current values flowing through the respective drivers, and a current value storing section 162 in which are stored in advance current values which should be detected at the current value detecting section 160 when the respective drivers are operating normally. Both the current value detecting section 160 and the current value storing section 162 are connected to the control section 100. The current value detecting section 160 is structured to include a resistor, a comparator, an A/D converter, and the like for detecting the current values (similarly to the current detecting circuit of FIG. 6).

At the control section 100, trouble sensing processing is carried out which, by comparing inputted detected current values with stored current values, judges whether or not trouble has arisen at the regions driven by the respective drivers.

FIG. 3 schematically shows a state in which the current values, which are to be detected at the current value detecting section 160 when the respective regions are operating normally (hereinafter called "normal current values"), are stored in the current value storing section 162. The normal current values generally vary over the passage of time. Therefore, in the present embodiment, the normal current value is stored as a normal current waveform which is obtained by plotting the progress of the normal current value with the normal current value on the vertical axis and time on the horizontal axis.

The normal current waveform differs in accordance with various conditions such as the sheet size, the position of the sheet feed tray, whether single-sided printing or double-sided printing is carried out, the number of printed sheets, and the like. Therefore, in the present embodiment, the normal current waveform for each region is stored for each of patterns (1 through n) which correspond to the operational state and the operating conditions and the like of the image forming device 10.

In the control section 100 relating to the present embodiment, each time any region is turned on or off, the currents are compared and trouble sensing is carried out. For each pattern, the normal current waveform is stored per sensing time period, where the sensing time periods are partitioned at times (A through J) at which the region is turned on or off.

Figure 4:
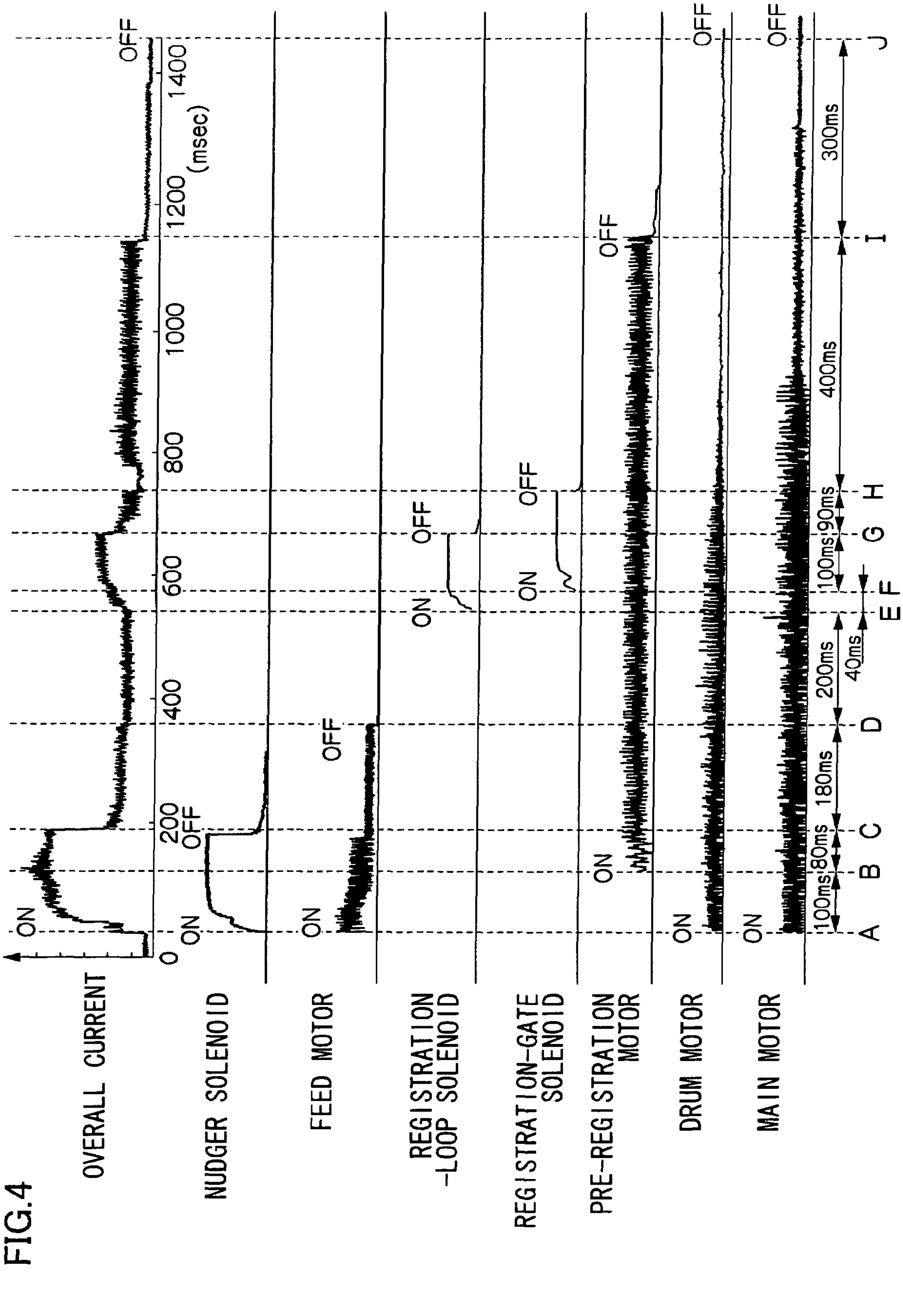
FIG. 4 is a time chart showing examples of the normal current waveforms.

An example of normal current waveforms stored in the current value storing section 162 is shown as a time chart in FIG. 4. The example shown in FIG. 4 is normal current waveforms of the respective regions in a case in which the sheet size is A4, the sheet is fed from the sheet feed tray 20, and single-sided printing is carried out (i.e., pattern 1 in FIG. 3). Further, A through J in FIG. 4 are the times when the respective regions are turned on and off, and correspond to A through J in FIG. 3.

A waveform, in which the normal current waveforms of the respective regions shown in FIG. 4 are combined together, is the normal current waveform of the overall current. When the respective regions are operating normally, the detected current waveform is the waveform marked "overall current" in FIG. 4.

In a case in which trouble arises, the control section 100 compares the absolute value of the difference between the inputted detected current value and the read normal current value, with the normal current values of the respective regions, and specifies the region with the nearest normal current value as a region at which trouble has arisen.

Figure 6:
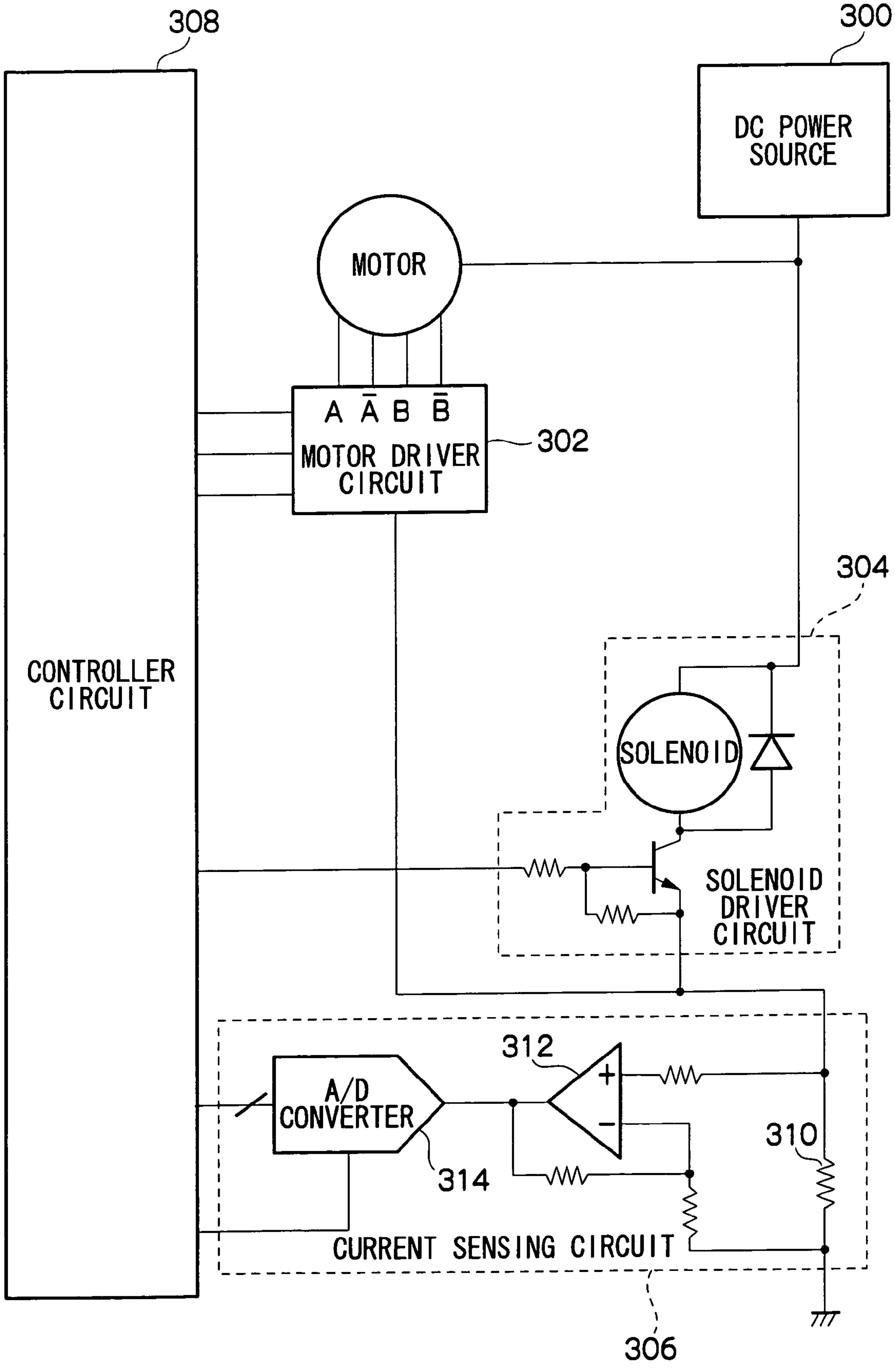
FIG. 6 shows an example of a circuit structure for carrying out fetching of the normal current waveforms.

FIG. 6 shows an example of a circuit structure for fetching the normal current waveforms as reference. As shown in FIG. 6, the current, which is supplied from the DC power source 300 and passes through a motor driver circuit 302 and a solenoid driver circuit 304, is fetched at a control circuit 308 via a current sensing circuit 306. In a circuit of such a structure, the normal current waveforms of the respective regions are measured by operating the respective regions independently.

The current sensing circuit 306 is structure to include a load resistor 310, an operational amplifier 312, an A/D converter 314, and the like. At the current sensing circuit, the current value, which corresponds to the potential difference at the both ends of the load resistor 310, is inputted to the A/D converter 314 by the operational amplifier 312, and is digitized via the A/D converter 314.

For example, in the case in which the normal current waveform of the nudger solenoid is fetched, because the pre-registration motor is turned on during the period of time from the time the nudger solenoid is turned on to the time it is turned off, the time over which the nudger solenoid is on is divided into two sections, which are A-B and B-C. Accordingly, the current waveform of 100 ms from the turning on of the nudger solenoid is stored in a memory or the like as the normal current waveform of the nudger solenoid for the time period A-B. Next, the current waveform of 80 ms from the point in time of 100 ms after the nudger solenoid is turned on is stored in a memory or the like as the normal current waveform of the nudger solenoid for the time period B-C.

Further, in the case in which the normal current waveform of the feed motor is fetched, the time over which the feed motor is on is divided into three because the pre-registration motor is turned on and the nudger solenoid is turned off during the period of time from the time the feed motor is turned on to the time it is turned off. 100 ms from the turning on of the feed motor is stored in a memory as feed motor A-B. Next, the current waveform of 80 ms from the point in time of 100 ms after the feed motor is turned on is stored in a memory or the like as the normal current waveform of the feed motor for the time period B-C. The current waveform of 180 ms from the point in time of 180 ms after the feed motor is turned on is stored in a memory or the like as the normal current waveform of the feed motor for the time period C-D.

The same is carried out for the other parts as well, and the current waveforms are stored in the memory in the divisional units shown in FIG. 4.

Next, operation of the present embodiment will be described.

At the image forming device 10 relating to the present embodiment, when an image forming instruction is inputted, the nudger solenoid and feed motor for feeding a sheet are turned on and operated, and the sheet is fed-out from the sheet-feeding tray 20 onto the conveying path. At this time, the drum motor and the main motor also are turned on simultaneously, and image formation starts. In this way, the processes of xerography, such as exposure, developing, and the like, which are based on the image data which is the subject of the image formation instruction, are carried out with respect to the photosensitive drum 50.

When the sheet passes through the sheet feeding rollers, the pre-registration motor, the registration-loop solenoid, the registration-gate solenoid, and the like are successively turned on and operated.

Figure 5:
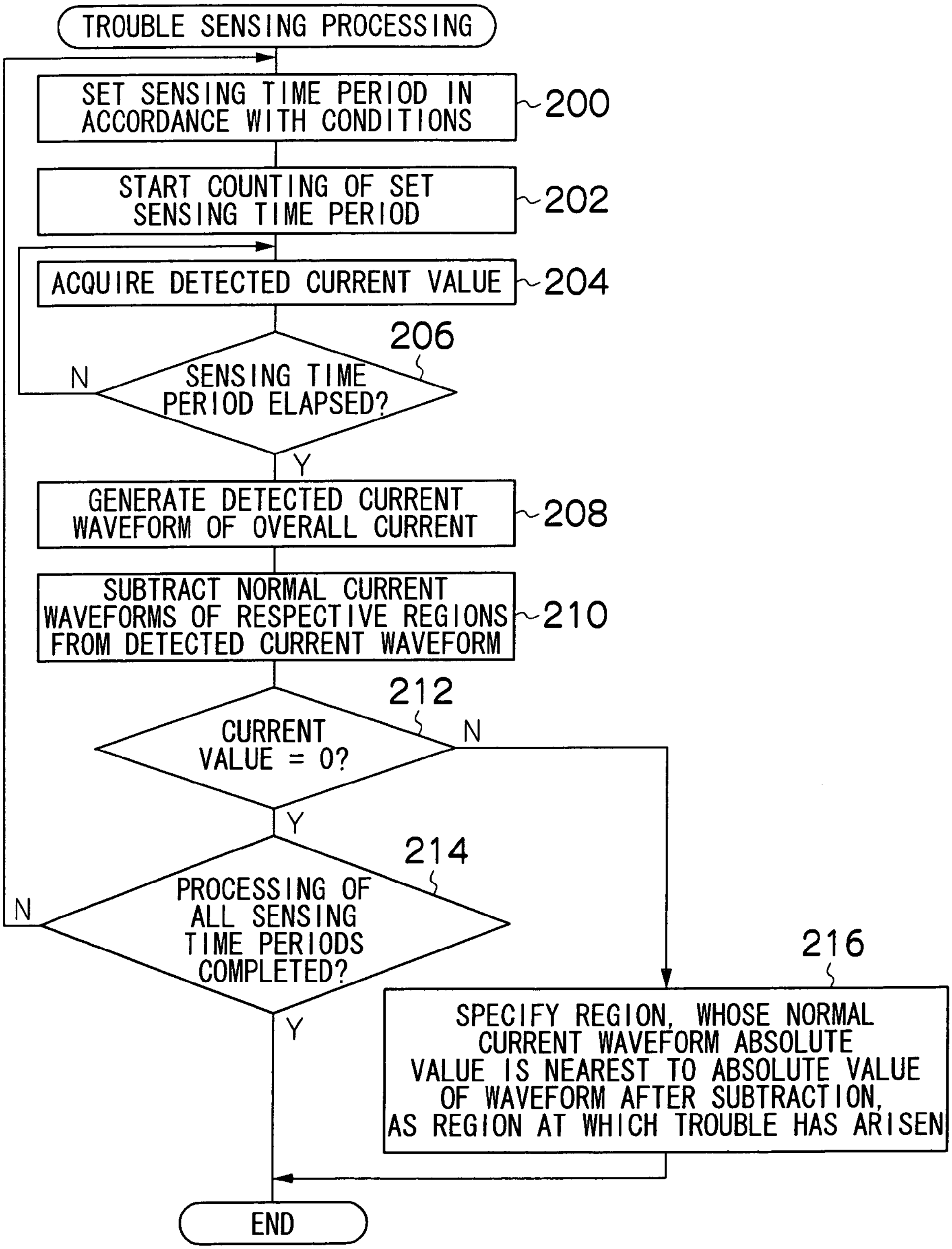
FIG. 5 is a flowchart showing the flow of a trouble sensing processing relating to the embodiment.

FIG. 5 is a flowchart showing the flow of the trouble sensing processing executed by the control section 100 when an image formation instruction is inputted. Hereinafter, with reference to FIG. 5, explanation will be given of the trouble sensing processing relating to the present embodiment.

First, in step 200, a sensing time period is set. In subsequent step 202, counting of the sensing time period is started. Thereafter, the routine moves onto step 204 where the detected current value is acquired.

The sensing time period is set in accordance with the present sensing time period and the pattern (pattern 1 through pattern n) which is based on the sheet size and the printing conditions corresponding to the image forming instruction. For example, in the case of time period B-C of pattern 1, 80 ms (see FIG. 4) is set as the sensing time period.

Further, the overall current can be sensed by providing current sensors on the current lines which pass through the drivers of the respective regions. Resistors may be used in this current sensing. However, in a case in which a voltage drop arises at a resistor and leads to trouble with the operation of the part, Hall elements, in which there are no voltage drops, may be used.

Usually, the current is digitized by the A/D converter and is fetched by the controller (see FIG. 6). It is preferable that the sampling frequency of the A/D converter is the same sampling frequency as the fetching of the normal current waveform.

In subsequent step 206, it is judged whether or not the set sensing time period has elapsed. If the answer to this judgment is negative, the routine returns to step 204 again. On the other hand, if there is an affirmative judgment in step 206, it is judged that all of the detected current values of the sensing time period are acquired, and the routine moves on to step 208 where a detected current waveform of the overall current is generated. The detected current waveform is generated by plotting the detected current values on the vertical axis and time on the horizontal axis, in the same way as the normal current waveforms.

In next step 210, the normal current waveforms of the respective regions are subtracted from the detected current waveform. For example, the normal current waveforms of the nudger solenoid, the feed motor, the drum motor, and the main motor for the time period A-B, are subtracted from the detected current waveform for that same time period A-B. If the respective parts are operating normally during the sensing time period, the detected current waveform of time period A-B equals the total of the normal current waveforms of the nudger solenoid, the feed motor, the drum motor, and the main motor for the time period A-B. Therefore, the subtraction results are a waveform which is current value=0. Namely, from the subtraction results, it can be known whether or not trouble has arisen at the parts.

For example, assuming that the driving circuit of the feed motor driver is disconnected, the overall current when the image forming device 10 is operated is lower by an amount corresponding to the current waveform when the feed motor is operated alone at the sections A-B, B-C, C-D.

The subtraction of the current waveforms may be carried out in units of sample numbers of the normal current waveforms, or a value obtained by taking the average or the mean square of the waveforms of the current in units of divisional sections in advance may be used. In a case in which the average value or the mean square is used, the current waveform may be fetched as the average value or the mean square at the stage of fetching the waveform. In a case in which the waveform is fetched as the average value or the mean square, there is the advantage that the memory is not used up by fetching the waveform as is.

In next step 212, it is judged whether the results of subtraction are current value=0. If this judgment is affirmative, it is judged that the respective regions are operating normally, and the routine moves on to step 214 where it is judged whether processing of all of the sensing time periods is completed. If the judgment in step 214 is negative, the routine returns to step 200 again, and carries out processing of the next sensing time period. On the other hand, if the judgment in step 214 is affirmative, the present trouble sensing processing ends.

If the judgment in step 212 is negative, it is judged that there exists a region which is not operating normally. The routine proceeds to step 216 where the region, whose normal current waveform absolute value is nearest to the waveform after subtraction, is specified as a region where trouble has arisen, and thereafter, the present trouble sensing processing routine ends.

As described above in detail, in accordance with the present embodiment, electric power is supplied from the DC power source 102 to respective driving mechanisms such as the motors and solenoids and the like, via plural driving drivers for driving the plural driving mechanisms. One of plural operational patterns which are set in advance is selected, and on/off control of the respective driving mechanisms is carried out via the respective driving drivers in accordance with the selected operational pattern. At the time when this on/off control is carried out by the control means, the total sum of the driving current of the plural driving drivers is detected. Further, a normal current waveform, which expresses changes over time in the total sum of the driving current at the time when the plural driving mechanisms are respectively driving normally, is stored in advance in the current value storing section 162 per operational pattern. The detected current waveform, which expresses the changes over time in the driving current detected at the current value detecting section 160, and the normal current waveform corresponding to the operational pattern, are compared. When the results of comparison are that the detected current waveform and the normal current waveform are different, it is judged that trouble has arisen at the driving mechanisms. Thus, even in a case in which plural parts are operated simultaneously, trouble sensing can be carried out without carrying out a special operation for sensing trouble.

In accordance with the present embodiment, the normal current waveforms are stored in advance per sensing time period, and the sensing time periods are partitioned at times (A through J) at which the driving of the respective portions is turned on and off in accordance with the control state of each region. The judgment of trouble is carried out for each sensing time period. Therefore, trouble sensing can be carried out accurately by focusing on changes in the driving current of each region, and the like.

Further, in the present embodiment, the normal current waveforms of the respective driving mechanisms also are stored in advance, and the region at which the trouble has arisen is specified. Therefore, there is no need for an operator to separately carry out the specifying of the place where trouble has arisen.

Note that, in the present embodiment, explanation is given of a form in which the normal current waveform of each region is stored in advance. However, the present invention is not limited to the same, and may be a form in which only the normal current waveform of the overall current is stored and only the presence/absence of the occurrence of trouble is sensed.

Moreover, in the present embodiment, explanation is given only of trouble sensing processing. However, in a case in which trouble is sensed by this trouble sensing processing, notification may be given of information expressing that fact. As a notifying means for such notification, an operation panel or the like may be provided at the image forming device and notification may be displayed on the operation panel, or a buzzer or the like may be provided and made to sound, or a speaker or the like may be provided and a voice may be played-back. Further, communication means or the like may be provided separately, and information expressing that trouble has arisen at a driving mechanism may be outputted to a computer or a terminal or the like of the manager or a customer center or the like which is external to the device.

Further, a second aspect of the present invention is a trouble sensing device comprising: plural driving drivers for driving plural driving mechanisms; a power source supplying electric power to the respective driving mechanisms via the respective driving drivers; a control section selecting any of plural operational patterns which are set in advance, and carrying out on/off control of the respective driving mechanisms via the respective driving drivers in accordance with the selected operational pattern; a driving current detecting section detecting a total sum of driving current of the plural driving drivers at a time when the on/off control is carried out by the control section; a storing section in which a normal driving current waveform, which shows changes over time of a total sum of driving current at a time when the plural driving mechanisms are respectively driving normally, is stored in advance for each operational pattern; a comparing section comparing a detected driving current waveform, which shows changes over time in the driving current detected by the driving current detecting section, and the normal driving current waveform, which corresponds to the operational pattern by the control section; and a judging section which, on the basis of results of comparison by the comparing section, judges that trouble has arisen at the driving mechanisms if the detected driving current waveform and the normal driving current waveform are different.

The second aspect may be structured as follows: the normal driving current waveform is stored in advance in the storing section per sensing time period, where the sensing time periods are sectioned off at times when the respective driving mechanisms corresponding to the operational pattern are turned on and off, the comparing section carries out the comparison for each sensing time period, and the judging section carries out the judgment for each sensing time period.

In accordance with the above-described structure, attention is focused on the fact that the detected driving current waveform varies greatly at the times when the driving of the respective driving mechanisms is turned on and off. By carrying out trouble sensing by partitioning into sensing time periods which are sectioned off at these times, as compared with a case in which the sensing time period is merely set per unit time period, trouble sensing can be carried out accurately by focusing on the changes in the driving current of the respective driving mechanisms, or the like. Further, as compared with a case in which the period of time from the start to the end of the control based on the operational pattern is used as the sensing time period, it is possible to reduce the temporary storage capacity, the processing load of the comparing processing, and the like.

It is also possible to utilize a structure in which plural normal driving current waveforms, which respectively show changes over time in the driving current of the respective driving mechanisms, are stored in advance in the storing section, the comparing section compares the detected driving current waveform and a total sum of the normal driving current waveforms of the respective driving mechanisms, and the trouble sensing device further comprises a specifying section which, in a case in which it is judged by the judging section that trouble has arisen, specifies the driving mechanism, which has a normal driving current waveform which is nearest to an absolute value of a difference between the detected driving current waveform and the total sum of the normal driving current waveforms of the respective driving mechanisms, as a driving mechanism at which trouble has arisen.

In accordance with the above-described structure, normal driving current waveforms for the respective driving mechanisms also are stored in advance, and the place where trouble has arisen is specified. Therefore, the device can also carry out specifying of the place where trouble has arisen, and the burden of processing of an operator or the like can be reduced.

According to the present embodiment, description is given of a form in which trouble sensing is carried out by using the results of detection themselves. However, trouble sensing may be carried out by using the cross-correlation coefficients between the currents of the respective driving mechanisms and the overall current, which coefficients are derived on the basis of the results of detection.

For example, the following is possible: the cross-correlation coefficients between the normal driving current waveforms of the respective driving mechanisms and the total sum of the normal driving current waveforms of the respective driving mechanisms, in a case in which the driving mechanisms are respectively driving normally, are stored in advance. The cross-correlation coefficients between the detected driving current waveform and the respective normal driving current waveforms are respectively derived. The derived cross-correlation coefficients, and cross-correlation coefficients which are in accordance with the control state (pattern) at the time of detecting the detected driving current waveform used in the derivation, are respectively compared. It is judged that trouble has arisen at a driving mechanism at which the both are different.

The cross-correlation coefficient of a driving mechanism expresses the correlation of the amount of change in the driving current of that driving mechanism with respect to the amount of change in the total sum of the driving current of the respective driving mechanisms. If trouble arises in any region, a difference will arise between (A) the cross-correlation coefficient between the detected driving current waveform and the normal driving current waveform of the driving mechanism which is having trouble, and (B) the cross-correlation coefficient between the normal driving current waveform and the normal driving current waveform of the driving mechanism which is having trouble. Note that a marked difference will not arise between the two in the case of a normal driving mechanism.

More concretely, cross-correlation coefficients are computed in advance between the current waveform of each part and the overall current at each section. These values are stored in a memory or the like together with the current waveforms of the sections. The cross-correlation coefficients between the overall current and the waveforms of the parts in the section which is to be investigated are computed, and if the results thereof are different from the cross-correlation coefficients which are stored in advance, it can be judged that there is trouble with those parts. In a case of using the cross-correlation coefficients, slightly more memory capacity is used than in a case of carrying out subtraction by using the results of detection themselves as in the above-described embodiment. However, it is possible to specify what type of trouble has arisen even in the case of excess current at the time of excess load when the part cannot be specified by subtraction. Moreover, even if two or more parts which are operating in the same section are in trouble, it can be sensed which and which are having trouble.

For example, in section A-B of FIG. 4, the pre-registration motor does not operate. However, supposing that the pre-registration motor were not operating due to trouble, the cross-correlation coefficients would be as follows.

| | |
|---|---|
| nudger solenoid | 0.66 |
| feed motor | 0.84 |
| drum motor | 0.1059074 |
| main motor | 0.186037 |
| pre-registration motor | −0.04321231 |

In this way, it can be known that there is hardly any correlation with the pre-registration motor. The nudger solenoid and the feed motor have relatively characteristic waveforms, and therefore, have large cross-correlation coefficients. On the other hand, the drum motor and the main motor have no characteristics, and therefore have small cross-correlation coefficients. Accordingly, the cross-correlation coefficients in a normal state are computed in advance, and trouble sensing can be carried out by whether or not the cross-correlation coefficient based on the detected driving current waveform is smaller than these cross-correlation coefficients, or the like.

Note that the structure of the image forming device 10 (see FIGS. 1 through 4) and the flow of processings (see FIG. 5) in the present embodiment are examples, and appropriate modifications may of course be made thereto.

As mentioned above, according to an aspect of the present invention, there is provided a trouble sensing device in which, even if plural parts are operating simultaneously, trouble sensing can be carried out without executing a special operation for sensing trouble.

The trouble sensing device of plural driving mechanisms, has: a first unit that determines a total sum of driving current of the plural driving mechanisms; and a second unit that judges whether trouble has arisen, on the basis of the total sum of the driving current. On the basis of the total sum of the driving current, it is judged whether trouble has arisen. Therefore, even in a case in which plural parts are operating simultaneously, trouble sensing can be carried out without carrying out operation in a special mode or operational state for sensing trouble.

According to an aspect of the present invention, there is provided a trouble sensing device has: plural driving drivers for driving plural driving mechanisms; a power source supplying electric power to the respective driving mechanisms via the respective driving drivers; a control section selecting any of plural operational patterns which are set in advance, and carrying out on/off control of the respective driving mechanisms via the respective driving drivers in accordance with the selected operational pattern; a driving current detecting section detecting a total sum of driving current of the plural driving drivers at a time when the on/off control is carried out by the control section; a storing section in which a normal driving current waveform, which shows changes over time of a total sum of driving current at a time when the plural driving mechanisms are respectively driving normally, is stored in advance for each operational pattern; a comparing section comparing a detected driving current waveform, which shows changes over time in the driving current detected by the driving current detecting section, and the normal driving current waveform, which corresponds to the operational pattern by the control section; and a judging section which, on the basis of results of comparison by the comparing section, judges that trouble has arisen at the driving mechanisms if the detected driving current waveform and the normal driving current waveform are different. The plural driving mechanisms are driven due to electric power being supplied thereto from the power source via the plural driving drivers, respectively. The driving of the respective driving mechanisms is controlled via the respective driving drivers in accordance with any of the plural operational patterns which are set in advance, which operational pattern is selected by the control section.

Here, the total sum of the driving current (current value) at the plural driving drivers at the time of carrying out on/off control by the control section, is detected by the driving current detecting section. Further, a normal driving current waveform, which shows the changes over time in the total sum of the driving current (the current value) at the time when the plural driving mechanisms are respectively operating normally, is stored in advance in the storing section per operational pattern. The detected driving current waveform, which shows changes over time in the driving current detected by the driving current detecting section, and the normal driving current waveform, which is in accordance with the operational pattern by the control section, are compared by the comparing section. If the detected driving current waveform and the normal driving current waveform are different, it is judged by the judging section that trouble has arisen at the driving mechanisms.

Namely, when the detected driving current waveform and the normal driving current waveform are compared, the both substantially match in a case in which the respective regions are driving normally. However, if trouble has arisen at any of the regions, the both are different. Trouble sensing can be carried out without carrying out a special operation for sensing trouble.

The normal driving current waveform, which is compared with the detected driving current waveform, is stored in advance for each operational pattern at the time of detecting the detected driving current waveform. Because the detected driving current waveform is compared with the normal driving current waveform which corresponds to the operational pattern at the time of detecting the detected driving current waveform, even if plural parts are operated simultaneously, trouble sensing can be carried out easily without carrying out a special operation for sensing trouble.

According to an aspect of the present invention, there is provided a trouble sensing device has: plural driving drivers for driving plural driving mechanisms; a power source supplying electric power to the respective driving mechanisms via the respective driving drivers; a control section selecting any of plural operational patterns which are set in advance, and carrying out on/off control of the respective driving mechanisms via the respective driving drivers in accordance with the selected operational pattern; a driving current detecting section detecting a total sum of driving current at the plural driving drivers; a storing section storing, in advance and for each operational pattern, cross-correlation coefficients of respective normal driving current waveforms with respect to a total sum of the plural normal driving current waveforms which express changes over time in the driving current of the respective driving mechanisms at a time when the plural driving mechanisms are respectively driving normally, the cross-correlation coefficients being derived in advance per sensing time period where the sensing time periods are sectioned off at times of turning the respective driving mechanisms on and off in accordance with the operational pattern; a deriving section deriving, for each of the sensing time periods, cross-correlation coefficients of respective normal driving currents with respect to a detected driving current waveform which expresses changes over time in the driving current detected by the detecting section; a comparing section which compares the cross-correlation coefficients derived by the deriving section, and the cross-correlation coefficients corresponding to a sensing time period and an operational pattern at a time of detecting the driving current used in derivation; and a judging section which, on the basis of results of comparison of the comparing section, judges that a driving mechanism, whose respective cross-correlation coefficients differ, is a driving mechanism at which trouble has arisen. The plural driving mechanisms are driven due to electric power being supplied thereto from the power source via the plural driving drivers, respectively. The driving of the respective driving mechanisms is controlled via the respective driving drivers in accordance with any of the plural operational patterns which are set in advance, which operational pattern is selected by the control section.

Here, the total sum of the driving current at the plural driving drivers at the time of carrying out the on/off control by the control section, is detected by the driving current detecting section. Further, there are stored, in advance and for each of the operational patterns, cross-correlation coefficients of the respective normal driving current waveforms with respect to a total sum of the plural normal driving current waveforms which express changes over time in driving current of the respective driving mechanisms at a time when the plural driving mechanisms are respectively driving normally, where the cross-correlation coefficients are derived in advance per sensing time period where the sensing time periods are sectioned off at times of turning the respective driving mechanisms on and off in accordance with the operational pattern. The deriving section derives, for each of the sensing time periods, cross-correlation coefficients of the respective normal driving currents with respect to the detected driving current waveform which expresses changes over time in the driving current detected by the detecting section. The cross-correlation coefficients derived by the deriving section, and the cross-correlation coefficients corresponding to the sensing time period and the operational pattern at the time of detecting the driving current used in derivation, are compared by the comparing section. On the basis of results of comparison, the judging section judges that a driving mechanism, whose respective cross-correlation coefficients differ, is a driving mechanism at which trouble has arisen.

The cross-correlation coefficient of each driving mechanism expresses the correlation of the amount of change in the driving current of that driving mechanism with respect to the amount of change in the total sum of the driving current waveform of the respective driving mechanisms. If trouble arises at any region, a difference will arise between (A) the cross-correlation coefficient between the detected driving current and the normal driving current of the driving mechanism which is having trouble, and (B) the cross-correlation coefficient between the normal driving current and the normal driving current of the driving mechanism which is having trouble. Note that a marked difference will not arise between the two in the case of a normal driving mechanism.

As described above, in the present invention, electric power is supplied to respective driving mechanisms via plural driving drivers for driving the plural driving mechanisms. Any of plural operational patterns which are set in advance is selected, and on/off control of the respective driving mechanisms is carried out via the respective driving drivers in accordance with the selected operational pattern. The total sum of the driving current at the plural driving drivers at the time of carrying out the on/off control by the control section is detected. Further, there are stored, in advance and for each of the operational patterns, a normal driving current waveform showing changes over time in the total sum of the driving current at the time when the plural driving mechanisms are respectively driving normally. The detected driving current waveform, which shows changes over time in the driving current detected by the driving current detecting section, and the normal driving current waveform, which corresponds to the operational pattern, are compared. On the basis of the results of comparison, it is judged that trouble has arisen at the driving mechanism if the detected driving current waveform and the normal driving current waveform are different. Therefore, the present invention has the excellent effect of providing a trouble sensing device in which, even if plural parts are operating simultaneously, trouble sensing can be carried out without carrying out a special operation for sensing trouble.

What is claimed is:

1. A trouble sensing device comprising:

a first unit that determines a total sum of driving current of a plurality of driving mechanisms two or more of which are turned on; and a second unit that judges whether trouble has arisen based on the total sum of the driving current; and a third unit that stores a plurality of normal driving current values expressing driving current when the plurality of driving mechanisms are respectively driven normally, wherein when the second unit judges that trouble has arisen at any of the plurality of driving mechanisms, the second unit specifies a driving mechanism that has a normal driving current value which is nearest to an absolute value of a difference between a detected driving current value and the total sum of the normal driving current values, as a driving mechanism at which trouble has arisen.

2. The trouble sensing device according to claim 1, further comprising:

a fourth unit that compares a total sum of the normal driving current values with a value of the total sum of the driving current determined by the first unit.

3. The trouble sensing device according to claim 2, wherein the second unit judges whether trouble has arisen based on a result by comparing the total sum of the normal driving current values with the value of the total sum of the driving current.

4. A trouble sensing device comprising:

a driving current detecting section that detects a detected driving current value of a plurality of driving mechanisms two or more of which are turned on;

a storing section that stores a plurality of normal driving current values expressing driving current at a time when two or more of the plurality of driving mechanisms are turned on and respectively driving normally; and a controller that compares a total sum of the normal driving current values and the detected driving current value, and judges that trouble has arisen at any of the driving mechanisms in a case in which the total sum of the normal driving current values and the detected driving current value are different, wherein when the controller judges that trouble has arisen at any of the plurality of driving mechanisms, the controller specifies a driving mechanism that has a normal driving current value which is nearest to an absolute value of a difference between the detected driving current value and the total sum of the normal driving current values, as a driving mechanism at which trouble has arisen.

5. The trouble sensing device according to claim 4, wherein the controller subtracts the total sum of the normal driving current values from the detected driving current value, and judges that the plurality of driving mechanisms are operating normally in a case in which a difference is substantially zero.

6. The trouble sensing device according to claim 4, wherein the normal driving current values express the driving current at a time when the plurality of driving mechanisms are respectively driving normally, for each of a plurality of operational patterns set in advance, and in accordance with each of the operational patterns, the controller compares the detected driving current value and the total sum of the normal driving current values corresponding to each of the operational patterns.

7. The trouble sensing device according to claim 4, wherein the normal driving current values express normal driving current waveforms showing changes over time in the detected driving current at a time when the plurality of driving mechanisms are respectively driving normally, for each of time periods which are sectioned off at times when the plurality of driving mechanisms are respectively turned on and off, and for each of the time periods sectioned off at times when the plurality of driving mechanisms are respectively turned on and off, the controller compares a detected driving current waveform showing changes over time in the detected driving current, and a total sum of the normal driving current waveforms.

8. The trouble sensing device according to claim 6, wherein an operational pattern is formed of a combination including at least any of a paper size, a sheet feed tray, a number of printed sheets, and a single-sided/double-sided printing.

9. A trouble sensing device comprising:

a driving current detecting section that detects a detected driving current value of a plurality of driving mechanisms two or more of which are turned on;

a storing section that stores a plurality of normal driving current values expressing driving current at a time when two or more of the plurality of driving mechanisms are turned on and respectively driving normally; and a controller that compares a total sum of the normal driving current values and the detected driving current value, and judges that trouble has arisen at any of the driving mechanisms in a case in which the total sum of the normal driving current values and the detected driving current value are different, wherein the storing section stores a cross-correlation coefficient of a normal driving current value corresponding to each of the driving mechanisms with respect to the total sum of the plurality of the normal driving current values, and the controller derives cross-correlation coefficients each corresponding to a normal driving current value of a driving mechanism with respect to the detected driving current value, and respectively compares the derived cross-correlation coefficients with the stored cross-correlation coefficients, and specifies a driving mechanism, at which a derived cross-correlation coefficient and a stored cross-correlation coefficient differ, as a driving mechanism at which trouble has arisen.

10. A trouble sensing device comprising:

a plurality of driving drivers that drives a plurality of driving mechanisms;

a power source that supplies electric power to the driving mechanisms via respective ones of the driving drivers;

a control section that selects any of a plurality of operational patterns which are set in advance, and carrying out on/off control of the driving mechanisms via the respective ones of the driving drivers in accordance with a selected operational pattern;

a driving current detecting section that detects a total sum of driving currents of the plurality of driving drivers at a time when the on/off control is carried out by the control section;

a storing section in which a normal driving current waveform, which shows changes over time of a total sum of driving current at a time when the plurality of driving mechanisms are respectively driving normally, is stored in advance for each operational pattern;

a comparing section that compares a detected driving current waveform, which shows changes over time in the driving current detected by the driving current detecting section, and the normal driving current waveform, which corresponds to a selected operational pattern selected by the control section; and a judging section which, on the basis of results of comparison by the comparing section, judges that trouble has arisen at the driving mechanisms if the detected driving current waveform and the normal driving current waveform are different, wherein a plurality of normal driving current waveforms, each of which shows changes over time in a driving current of the respective driving mechanisms, are stored in advance in the storing section, the comparing section compares the detected driving current waveform and a total sum of the normal driving current waveforms of the driving mechanisms, and a specifying section which, in a case in which it is judged by the judging section that trouble has arisen, specifies the driving mechanism, which has a normal driving current waveform which is nearest to an absolute value of a difference between the detected driving current waveform and the total sum of the normal driving current waveforms of the driving mechanisms, as a driving mechanism at which trouble has arisen.

11. The trouble sensing device of claim 10, wherein the normal driving current waveform is stored in advance in the storing section during one or more sensing time periods where the sensing time periods are sectioned off at times when respective ones of the driving mechanisms are turned on and off in accordance with the selected operational pattern, the comparing section carries out a comparison for each sensing time period, and the judging section carries out a judgment for each sensing time period.

12. A trouble sensing device comprising:

a plurality of driving drivers for driving a plurality of driving mechanisms;

a power source supplying electric power to the driving mechanisms via respective ones of the driving drivers;

a control section selecting any of a plurality of operational patterns which are set in advance, and carrying out on/off control of the driving mechanisms via the respective ones of the driving drivers in accordance with a selected operational pattern;

a driving current detecting section detecting a total sum of driving currents of the plurality of driving drivers;

a storing section storing, in advance and for each operational pattern, cross-correlation coefficients each corresponding to one of normal driving current waveforms which express respect to a total sum of the plurality of normal driving current waveforms which express changes over time in the driving currents of the driving mechanisms at a time when the plurality of driving mechanisms are driving normally, the cross-correlation coefficients being derived in advance during sensing time periods where the sensing time periods are sectioned off at times of turning the respective driving mechanisms on and off in accordance with the selected operational pattern;

a deriving section deriving, for each of the sensing time periods, cross-correlation coefficients of the normal driving current waveforms with respect to a detected driving current waveform which expresses changes over time in a driving current detected by the detecting section;

a comparing section which compares the cross-correlation coefficients derived by the deriving section, and the cross-correlation coefficients corresponding to a sensing time period and an operational pattern at a time of detecting the driving current used in derivation; and a judging section which, on the basis of results of comparison of the comparing section, judges that a driving mechanism, whose cross-correlation coefficient differs from a corresponding stored cross-correlation coefficient is a driving mechanism at which trouble has arisen.

13. A trouble sensing method comprising:

storing a plurality of normal driving current values expressing driving currents at a time when two or more of a plurality of driving mechanisms are turned on and driving normally;

detecting a value of a driving current of the plurality of driving mechanisms;

comparing a total sum of the normal driving current values with a detected value of the driving current;

judging whether trouble has arisen based on a result of the comparing; and specifying a driving mechanism that has a normal driving current value which is nearest to an absolute value of a difference between the detected driving current value and the total sum of the normal driving current values, as a driving mechanism at which trouble has arisen.

14. A storage medium readable by a computer, the storage medium storing a program of instructions executable by the computer to perform a function for sensing trouble, the function comprising:

storing a plurality of normal driving current values expressing driving currents at a time when two or more of a plurality of driving mechanisms are turned on and driving normally;

detecting a value of a driving current of the plurality of driving mechanisms;

comparing a total sum of the normal driving current values with a detected value of the driving current;

judging whether trouble has arisen based on a result of the comparing; and specifying a driving mechanism that has a normal driving current value which is nearest to an absolute value of a difference between the detected driving current value and the total sum of the normal driving current values, as a driving mechanism at which trouble has arisen.

* * * * *